(12) United States Patent
Chen

(10) Patent No.: US 11,094,858 B2
(45) Date of Patent: Aug. 17, 2021

(54) TAPE, ENCAPSULATING PROCESS AND OPTICAL DEVICE

(71) Applicant: Advanced Semiconductor Engineering, Inc., Kaohsiung (TW)

(72) Inventor: Jenchun Chen, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/529,569

(22) Filed: Aug. 1, 2019

(65) Prior Publication Data

US 2021/0036194 A1 Feb. 4, 2021

(51) Int. Cl.

| H01L 33/00 | (2010.01) |
|---|---|
| H01L 23/48 | (2006.01) |
| H01L 21/00 | (2006.01) |
| H01L 33/56 | (2010.01) |
| H01L 33/54 | (2010.01) |
| H01L 51/52 | (2006.01) |
| H01L 23/31 | (2006.01) |
| H01L 23/538 | (2006.01) |
| H01L 21/56 | (2006.01) |
| H01L 23/522 | (2006.01) |
| H01L 23/00 | (2006.01) |
| G02B 3/00 | (2006.01) |
| H01S 5/183 | (2006.01) |

(52) U.S. Cl.
CPC .......... *H01L 33/56* (2013.01); *H01L 21/56* (2013.01); *H01L 21/563* (2013.01); *H01L 23/3107* (2013.01); *H01L 23/5226* (2013.01); *H01L 23/5384* (2013.01); *H01L 24/97* (2013.01); *H01L 33/54* (2013.01); *H01L 51/5246* (2013.01); *G02B 3/0037* (2013.01); *H01S 5/183* (2013.01)

(58) Field of Classification Search
CPC . H01L 2924/181; H01L 23/315; H01L 21/56; H01L 21/563; H01L 33/56; H01L 33/54; H01L 51/5246; H01L 21/6836; H01L 24/97; H01L 23/3107
See application file for complete search history.

(56) References Cited

U.S. PATENT DOCUMENTS

| 8,084,335 B2* | 12/2011 | Seddon | H01L 21/6836 438/464 |
|---|---|---|---|
| 8,941,129 B1* | 1/2015 | Gershowitz | H01L 33/486 257/88 |
| 2005/0185088 A1* | 8/2005 | Kale | H01L 27/14623 348/374 |
| 2010/0099240 A1* | 4/2010 | Watanabe | H01L 24/27 438/464 |

(Continued)

*Primary Examiner* — Alonzo Chambliss
(74) *Attorney, Agent, or Firm* — Foley & Lardner LLP

(57) ABSTRACT

A tape includes at least one tape unit. The tape unit includes a base structure having a first portion and a second portion. The first portion has a first surface and a second surface opposite to the first surface. The second portion protrudes from the second surface of the first portion, and has a third surface opposite to the first surface of the first portion and a lateral surface extending between the second surface and the third surface. An area of the first portion from a top view is greater than an area of the second portion from a top view.

18 Claims, 15 Drawing Sheets

(56) References Cited

U.S. PATENT DOCUMENTS

| | | | |
|---|---|---|---|
| 2013/0299855 A1* | 11/2013 | Ku | H01L 33/486 |
| | | | 257/88 |
| 2016/0379847 A1* | 12/2016 | Porwol | H01L 23/28 |
| | | | 438/127 |
| 2018/0167538 A1* | 6/2018 | Wang | H05K 3/301 |
| 2019/0364183 A1* | 11/2019 | Wang | H04N 5/2253 |
| 2021/0088696 A1* | 3/2021 | Wang | H01L 27/14634 |

* cited by examiner

TAPE, ENCAPSULATING PROCESS AND OPTICAL DEVICE

BACKGROUND

1. Field of the Disclosure

The present disclosure relates to a tape, an encapsulating process and an optical device, and to a tape, an encapsulating process using the tape, and an optical device formed through the encapsulating process.

2. Description of the Related Art

An optical device may include a substrate, and an emitter and a detector disposed on a predetermined portion of the substrate. The emitter is used for emitting a light beam. The light beam is reflected by an object, and then detected by the detector. For protection of the substrate, the emitter and the detector, it is desired to form an irregular-shaped molding compound on the substrate. The molding compound should cover the substrate and define a through hole to expose the predetermined portion of the substrate, such that the emitter and the detector can be disposed in the through hole and on the predetermined portion of the substrate.

SUMMARY

In some embodiments, a tape includes at least one tape unit. The tape unit includes a base structure having a first portion and a second portion. The first portion has a first surface and a second surface opposite to the first surface. The second portion protrudes from the second surface of the first portion, and has a third surface opposite to the first surface of the first portion and a lateral surface extending between the second surface and the third surface. An area of the first portion from a top view is greater than an area of the second portion from a top view.

In some embodiments, an encapsulating process includes (a) providing a substrate; (b) disposing at least one tape unit on the substrate, wherein the tape unit includes a base structure, the base structure has a first portion and a second portion, the first portion has a first surface, a second surface opposite to the first surface and a first lateral surface extending between the first surface and the second surface, the second portion protrudes from the second surface, and has a third surface opposite to the first surface of the first portion and a second lateral surface extending between the second surface and the third surface, and an area of the first portion from a top view is greater than an area of the second portion from a top view; and (c) forming an encapsulant surrounding the tape unit.

In some embodiments, an optical device includes a substrate, a passive component and an encapsulant. The substrate has a surface. The passive component is disposed on the surface of the substrate. The encapsulant is disposed on the surface of the substrate and encapsulates the passive component. The encapsulant has a first lateral surface defining a through hole. An angle between the first lateral surface of the encapsulant and the surface of the substrate is about 90 degrees to about 110 degrees.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
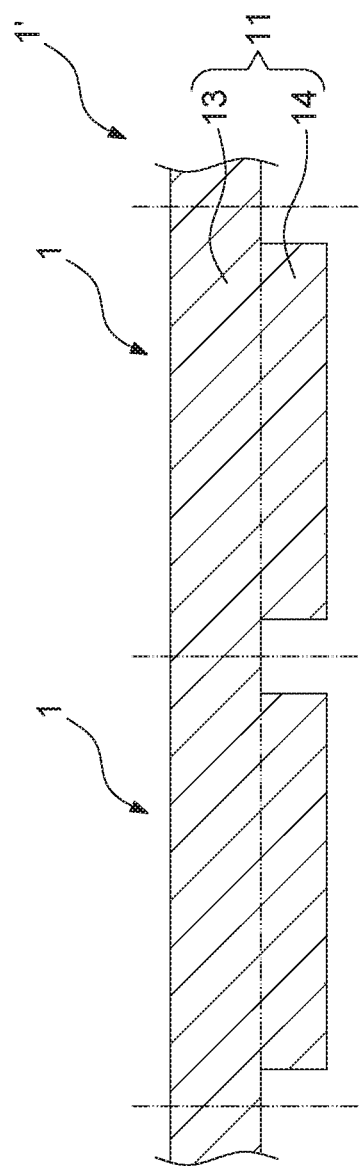
FIG. 1 illustrates a cross sectional view of an example of a tape according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a comparative process for forming an optical device, a mold is disposed on a substrate. The mold has a protrusion portion to abut against a surface of the substrate. Then, an encapsulant is formed on the surface of the substrate and surrounds the protrusion portion of the mold. After removing the mold, a through hole is formed corresponding to the protrusion portion of the mold. The through hole extends through the encapsulant to expose a portion of the surface of the substrate. Then, a light emitting component and a light receiving component are disposed in the through hole of the encapsulant and on the surface of the substrate. Then, a glass plate or a lens is disposed on the encapsulant to cover the through hole. That is, the glass plate or the lens is disposed above the light emitting component and the light receiving component.

In the aforementioned process, the mold is generally made of a hard metal, such as steel. Hence, the mold may easily damage the substrate when abutting against the surface of the substrate. The mold made of a hard metal may not adhere properly to the surface of the substrate, thus the encapsulant may flow into the gap between the protrusion portion and the surface of the substrate during the molding process. Besides, a large draft angle or a sharp draft taper is included on the mold made of a hard metal to prevent damage of the encapsulant when removing the mold. However, due the large draft angle or the sharp draft taper, a side wall of the through hole of the encapsulant may not be substantially perpendicular to the surface of the substrate, which may adversely affect functions of the light emitting component and/or the light receiving component.

Hence, at least some embodiments of the present disclosure provide for a tape, which can properly adhere to a surface of a substrate. At least some embodiments of the present disclosure further provide for an encapsulating process using the tape, and an optical device made through the encapsulating process.

FIG. 1 illustrates a cross sectional view of a tape 1' according to some embodiments of the present disclosure. The tape 1' includes at least one tape unit 1, such as two tape units 1. Each of the tape units 1 includes a base structure 11. The base structure 11 includes a first portion 13 and a second portion 14. The first portion 13 and the second portion 14 may be formed integrally as a monolithic structure. That is, there is no boundary between the first portion 13 and the second portion 14. The first portions 13 of the base structures 11 of the tape units 1 are connected such that the base structures 11 jointly form a monolithic structure. That is, the entire tape 1' may be a monolithic structure. In some embodiments, the tape 1' is an adhesive tape.

The base structure 11 may be made of a flexible and compressible material. A material of the base structure may be a polymer, such as polypropylene (PP), oriented polypropylene (OPP), biaxially oriented polypropylene (BOPP), polyethylene (PE), or polyvinyl chloride (PVC). The base structure 11 may be formed by injection molding or machining. In some embodiments, the tape 1' may be a thermal release tape which may be peeled off easily at a certain temperature. Further, the tape 1' may be a double-sided adhesive tape. When in use, the tape 1' may be cut to form two separated tape unit 1, such as the tape unit 1 shown in FIG. 3. Each of the tape units 1 may be used as a mold for forming a cavity of a product, such as the cavity 30 of the encapsulant 3 shown in FIG. 6. In some embodiments, since the base structure 11 is made of a flexible and compressible material, a large draft angle or a sharp draft taper is not necessary for the tape 1' or the tape unit 1.

Figure 2:
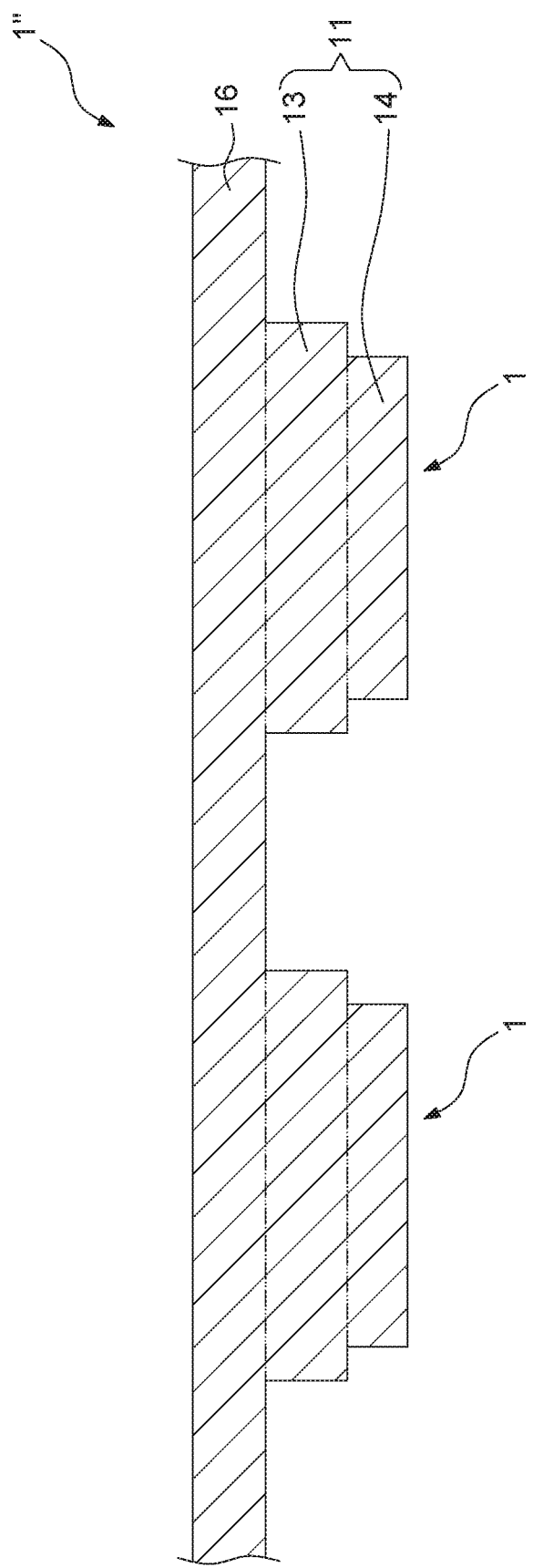
FIG. 2 illustrates a cross sectional view of an example of a tape according to some embodiments of the present disclosure.

FIG. 2 illustrates a cross sectional view of a tape 1" according to some embodiments of the present disclosure. The tape 1" includes at least one tape unit 1 similar to the tape unit 1 shown in FIGS. 1 and 3. However, the tape 1' further includes a carrier portion 16. The at least one tape unit 1 includes a plurality of tape units 1 disposed on the carrier portion 16. For example, the first portion 13 of the base structure 11 may be disposed on and contacts the carrier portion 16. In some embodiments, the tape units 1 and the carrier portion 16 may be formed integrally as a monolithic structure. That is, the entire tape 1" may be a monolithic structure. When in use, each of the tape units 1 may be cut or separated from the carrier portion 16. However, these tape units 1 may be directly used as a mold with the carrier portion 16 attached. Each of the tape units 1 may correspond to a cavity of a product, and the carrier portion 16 may correspond to an upper surface of the product. In other embodiments, the tape units 1 and the carrier portion 16 may be formed separately and then attached together to form the tape 1". For example, the carrier portion 16 may be a releasing paper, thus the tape units 1 may be easily removed from the carrier portion 16 when in use.

Figure 3:
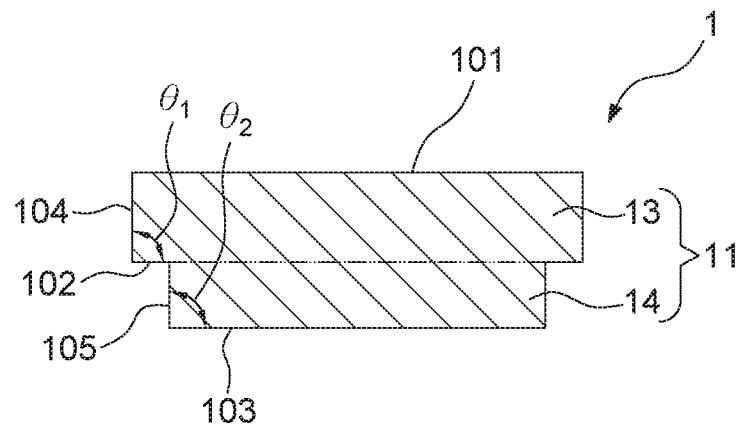
FIG. 3 illustrates a cross sectional view of an example of a tape unit according to some embodiments of the present disclosure.

FIG. 3 illustrates a cross sectional view of a tape unit 1, such as the tape unit 1 of the tape 1' shown in FIG. 1 or the tape 1" shown in FIG. 2.

As shown in FIG. 3, the tape unit 1 includes a base structure 11. The base structure 11 has a first portion 13 and a second portion 14. The first portion 13 has a first surface 101, a second surface 102 opposite to the first surface 101, and a first lateral surface 104 extending between the first surface 101 and the second surface 102. The second portion 14 protrudes from the second surface 102 of the first portion 13. The second portion 14 has a third surface 103 opposite to the first surface 101 of the first portion 13, and a second lateral surface 105 extending between the second surface 102 and the third surface 103. An area of the first portion 13 from a top view is greater than an area of the second portion 14 from a top view. In some embodiments, the first portion 13 and the second portion 14 may be formed integrally as a monolithic structure. That is, there is no boundary between the first portion 13 and the second portion 14.

The second surface 102 of the first portion 13 may be substantially perpendicular to the first lateral surface 104 of the first portion 13. An angle $\theta_1$ between the second surface 102 and the first lateral surface 104 of the first portion 13 is about 90 degrees to about 110 degrees, such about 90 degrees to about 100 degrees, about 90 degrees to about 95 degrees, about 90 degrees to about 93 degrees, or about 90 degrees to about 91 degrees. The third surface 103 of the second portion 14 may be substantially perpendicular to the second lateral surface 105 of the second portion 14. An angle $\theta_2$ between the third surface 103 and the second lateral surface 105 of the second portion 14 may be about 90 degrees to about 110 degrees, such about 90 degrees to about 100 degrees, about 90 degrees to about 95 degrees, about 90 degrees to about 93 degrees, or about 90 degrees to about 91 degrees. In some embodiments, the base structure 11 has a length (e.g., a length of the first portion 13) less than about 10 mm, such as less than 8 mm, less than 6 mm, less than 5 mm, less than 4 mm, or less than 3 mm. In some embodiments, the third surface 103 of the base structure 11 may be sticky. For example, the base structure 11 may be made of a non-reactive adhesive material, such as a pressure-sensitive adhesive.

Figure 4:
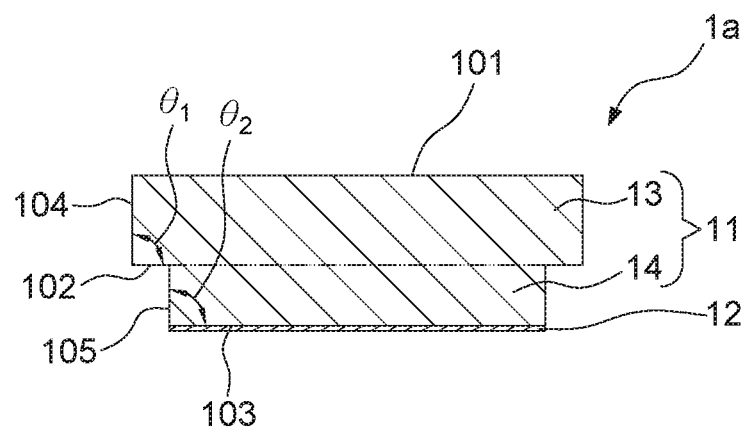
FIG. 4 illustrates a cross sectional view of an example of a tape unit according to some embodiments of the present disclosure.

FIG. 4 illustrates a cross sectional view of a tape unit 1a according to some embodiments of the present disclosure. The tape unit 1a is similar to the tape unit 1 shown in FIG. 3, but further includes an adhesive layer 12.

The adhesive layer 12 may be disposed on the third surface 103 of the second portion 14 of the base structure 11. The adhesive layer 12 may be formed by coating or disposing an adhesive on the third surface 103. In some embodiments, the adhesive layer 12 may be a thermal release adhesive. In some embodiments, a plurality of the tape units 1a may be connected to form a tape similar to the tape 1' shown in FIG. 1, or may be disposed on a carrier portion to form a tape similar to the tape 1'' shown in FIG. 2. In some embodiments, the adhesive layer 12 may be made of a non-reactive adhesive material, such as a pressure-sensitive adhesive.

Figure 5:
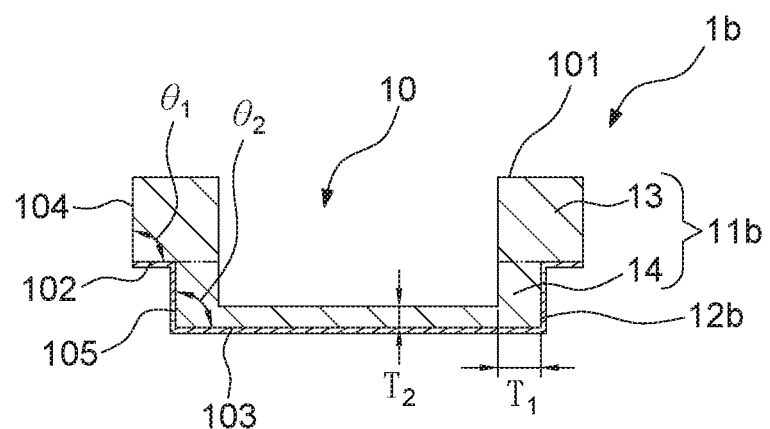
FIG. 5 illustrates a cross sectional view of an example of a tape unit according to some embodiments of the present disclosure.

FIG. 5 illustrates a cross sectional view of a tape unit 1b according to some embodiments of the present disclosure. The tape unit 1b is similar to the tape unit 1a shown in FIG. 4, except for the follows.

As shown in FIG. 5, the base structure 11b of the tape unit 1b defines a cavity 10 recessed from the first surface 101 of the first portion 13 thereof. The cavity 10 extends through the first portion 13 into the second portion 14 of the base structure 11b. The second portion 14 of the base structure 11b has a first thickness $T_1$ between the cavity 10 and the second lateral surface 105, and a second thickness $T_2$ between the cavity 10 and the third surface 103. The first thickness $T_1$ is greater than the second thickness $T_2$. In some embodiments, the cavity 10 is formed by machining such as milling. Besides, as shown in FIG. 5, the adhesive layer 12b is further disposed on the second lateral surface 105 of the second portion 14 and/or the second surface 102 of the first portion 13 of the base structure 11b.

Figure 6:
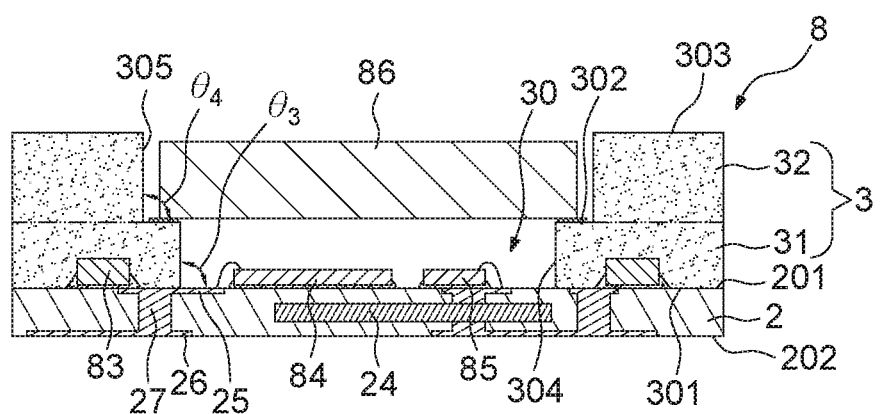
FIG. 6 illustrates a cross sectional view of an example of an optical device according to some embodiments of the present disclosure.

FIG. 6 illustrates a cross sectional view of an optical device 8 according to some embodiments of the present disclosure. The optical device 8 includes a substrate 2, two passive components 83, an encapsulant 3, a light emitting component 84, a light receiving component 85, and an optical lens 86.

The substrate 2 has a first surface 201 and a second surface 202 opposite to the first surface 201. The substrate 2 may be an embedded trace substrate. For example, the substrate 2 may include a first circuit layer 25 exposed from the first surface 201, a second circuit layer 26 exposed from the second surface 202, and a conductive via 27 electrically connecting the first circuit layer 25 and the second circuit layer 26. In some embodiments, the substrate 2 may further include a semiconductor chip 24 disposed between the first surface 21 and the second surface 22 (e.g., the semiconductor chip 24 may be embedded in the substrate 2), and electrically connected to the first circuit layer 25 and/or the second circuit layer 26.

The passive components 83 are disposed on the first surface 201 of the substrate 2, and are electrically connected to the substrate 2, such as the first circuit 25 and/or the semiconductor chip 24 of the substrate 2. Each of the passive components 83 may be a resistor, a capacitor, an inductor, a transformer, etc. In some embodiments, the optical device 8 may solely include one passive component 83, or may include more than two passive components 83.

The encapsulant 3 is disposed on the first surface 201 of the substrate 2 and encapsulates the passive components 83. The encapsulant 3 has a first portion 31 and a second portion 32, and defines a through hole 30. The first portion 31 and the second portion 32 may be formed integrally as a monolithic structure. That is, there is no boundary between the first portion 31 and the second portion 32. The first portion 31 has a first surface 301, a second surface 302 opposite to the first surface 301, and a first lateral surface 304 extending between the first surface 301 and the second surface 302. The first surface 301 is disposed on the first surface 201 of the substrate 2. The first lateral surface 304 of the first portion 31 of the encapsulant 3 may be substantially perpendicular to the first surface 201 of the substrate 2. An angle $\theta_3$ between the first lateral surface 304 of the first portion 31 of the encapsulant 3 and the first surface 201 of the substrate 2 may be about 90 degrees to about 110 degrees, such about 90 degrees to about 100 degrees, about 90 degrees to about 95 degrees, about 90 degrees to about 93 degrees, or about 90 degrees to about 91 degrees. The second portion 32 protrudes from the second surface 302 of the first portion 31. The second portion 32 has a third surface 303 opposite to the first surface 301 of the first portion 31, and a second lateral surface 305 extending between the second surface 302 of the first portion 31 and the third surface 303. The second lateral surface 305 of the second portion 32 of the encapsulant 3 may be substantially perpendicular to the second surface 302 of the first portion 31 of the encapsulant 3. An angle $\theta_4$ between the second lateral surface 305 of the second portion 32 and the second surface 302 of the first portion 31 of the encapsulant 3 may be about 90 degrees to about 110 degrees, such about 90 degrees to about 100 degrees, about 90 degrees to about 95 degrees, about 90 degrees to about 93 degrees, or about 90 degrees to about 91 degrees.

The first lateral surface 304 and the second surface 302 of the first portion 31, and the second lateral surface 305 of the second portion 32 of the encapsulant 3 jointly defines the through hole 30. The through hole 30 extends through the encapsulant 3. The through hole 30 includes an upper portion (e.g., defined by the second lateral surface 305 of the encapsulant 3) and a lower portion (e.g., defined by the first lateral surface 304 of the encapsulant 3), and a width of the upper portion is greater than a width of the lower portion.

The encapsulant 3 may be made of a material which does not transmit light, and may thus be opaque. In some embodiments, the encapsulant 3 may be made of an epoxy molding compound (with or without fillers) including a black pigment, such as carbon black.

A portion of the first surface 201 of the substrate 2 is exposed in the through hole 30 of the encapsulant 3. The light emitting component 84 and the light receiving component 85 are disposed side by side on the exposed portion of the first surface 201 of the substrate 2 in the through hole 30 of the encapsulant 3. The light emitting component 84 and the light receiving component 85 are electrically connected to the substrate 2, such as the first circuit 25 and/or the semiconductor chip 24 of the substrate 2. The light emitting component 84 may be a component which is able to emit light of a single wavelength or a range of wavelengths, such as a laser diode or a vertical cavity surface-emitting laser (VCSEL). VCSEL is a laser diode with single-chip laser resonance function, which mainly emits light in the vertical direction on its top surface. Compared with the traditional edge emitting laser (EEL), the VCSEL has the advantages in compatibility with circuit and inspection instruments, reliability, expandability, economy, and packaging functions. Since the introduction of the face recognition technology supported by the VCSEL into the smart phone, the demand for the VCSEL is increasing in the industry. In addition, the light receiving element 85 may be a component which is able to receiving and/or detecting light reaching a light receiving area thereof, such as a photodiode.

The optical lens 86 is disposed on or attached to the second surface 302 of the encapsulant 3, and above the light emitting component 84 and the light receiving component 85. As shown in FIG. 6, the optical lens 86 is disposed in the upper portion of the through hole 30, and covers the lower portion of the through hole 30. Thus, the optical lens 86 is disposed above the light emitting component 84 and the light receiving component 85. The optical lens 86 may be a plate made of glass or polymer, and may be transparent or translucent. For example, the optical lens 86 may transmit light beam with desired wavelength(s). That is, the optical lens 86 may a light filter such as an infrared (IR) filter.

In the optical device 8, since the angle $\theta_3$ between the first lateral surface 304 of the first portion 31 of the encapsulant 3 and the first surface 201 of the substrate 2 is about 90 degrees to about 110 degrees (e.g., the first lateral surface 304 of the first portion 31 of the encapsulant 3 may be substantially perpendicular to the first surface 201 of the substrate 2), the influence of the first lateral surface 304 to the performance of the light emitting component 84 and/or the light receiving component 85 may be reduced.

FIGS. 7 to 11 illustrate an encapsulating process according to some embodiments of the present disclosure. In some embodiments, the encapsulating process can be used for manufacturing an optical device such as the optical device 8 shown in FIG. 6. The encapsulating process utilizes at least one tape unit, such as two of the tape units 1 shown in FIG. 3.

Figure 7:
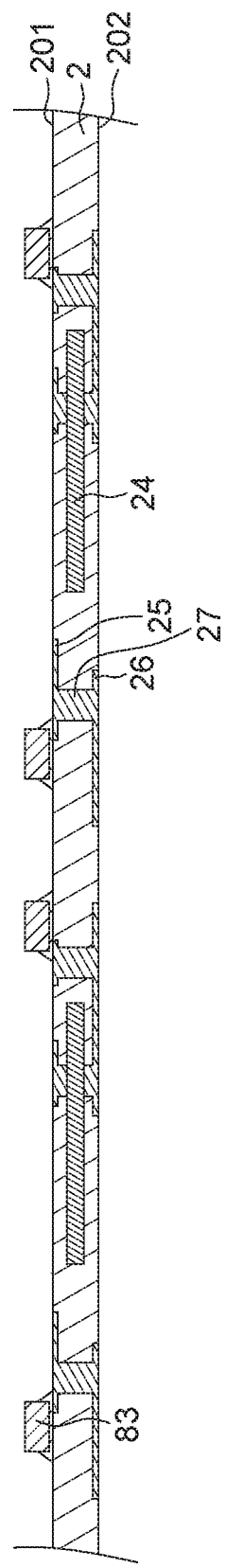
FIG. 7 illustrates one or more stages of an example of a method for manufacturing an optical device according to some embodiments of the present disclosure.

Referring to FIG. 7, a substrate 2 is provided. The substrate 2 has a first surface 201 and a second surface 202 opposite to the first surface 201. The substrate 2 may be an embedded trace substrate. For example, the substrate 2 may include a first circuit layer 25 exposed from the first surface 201, a second circuit layer 26 exposed from the second surface 202, and a conductive via 27 electrically connecting the first circuit layer 25 and the second circuit layer 26. In some embodiments, the substrate 2 may further include a semiconductor chip 24 disposed between the first surface 21 and the second surface 22 (e.g., the semiconductor chip may be embedded in the substrate 2), and electrically connected to the first circuit layer 25 and/or the second circuit layer 26. The substrate 2 shown in FIG. 7 may be used for manufacturing two or more optical devices. Then, four passive components 83 are disposed on the first surface 201 of the substrate 2. The passive components 83 are electrically connected to the substrate 2, such as the first circuit 25 and/or the semiconductor chip 24 of the substrate 2.

Figure 8:
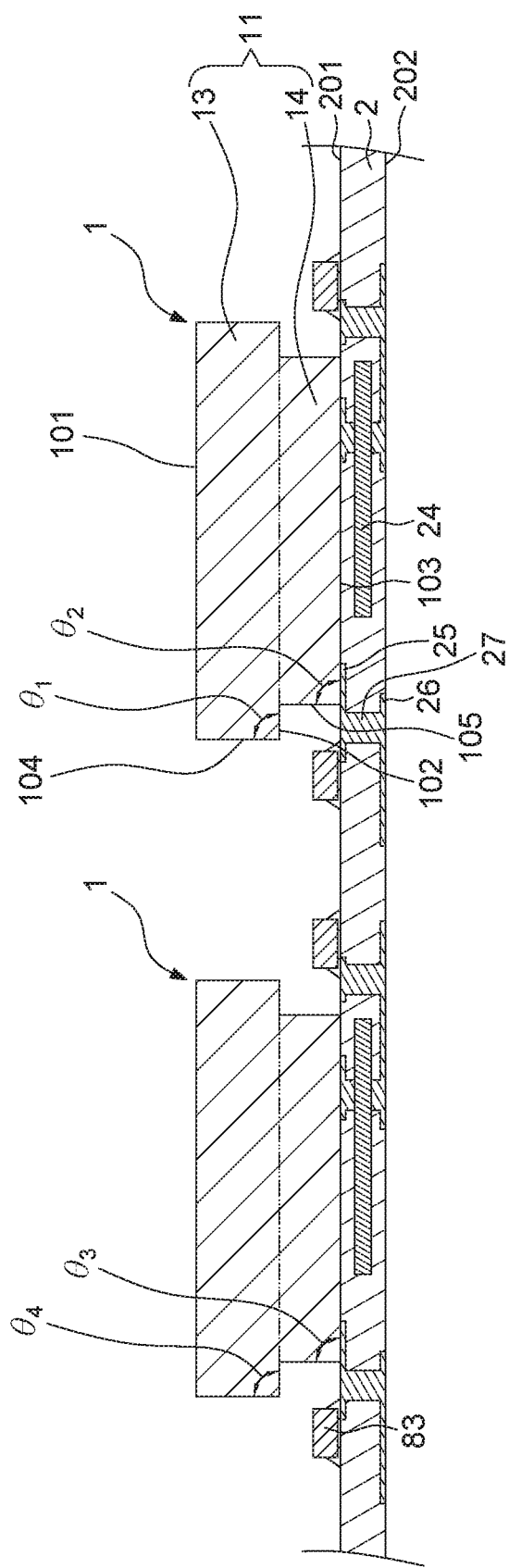
FIG. 8 illustrates one or more stages of an example of a method for manufacturing an optical device according to some embodiments of the present disclosure.

Referring to FIG. 8, at least one tape unit, such as two tape units 1 are disposed on the substrate 2. The tape unit 1 includes a base structure 11. The base structure 11 includes a first portion 13 and a second portion 14. The first portion 13 has a first surface 101, a second surface 102 opposite to the first surface 101, and a first lateral surface 104 extending between the first surface 101 and the second surface 102. The second portion 14 protrudes from the second surface 102 of the first portion 13. The second portion 14 has a third surface 103 opposite to the first surface 101 of the first portion 13, and a second lateral surface 105 extending between the second surface 102 and the third surface 103. An area of the first portion 13 from a top view is greater than an area of the second portion 14 from a top view.

The second surface 102 of the first portion 13 may be substantially perpendicular to the first lateral surface 104 of the first portion 13. An angle $\theta_1$ between the second surface 102 and the first lateral surface 104 of the first portion 13 is about 90 degrees to about 110 degrees. The third surface 103 of the second portion 14 may be substantially perpendicular to the second lateral surface 105 of the second portion 14. An angle $\theta_2$ between the third surface 103 and the second lateral surface 105 of the second portion 14 may be about 90 degrees to about 110 degrees. The third surface 103 of the base structure 11 contacts and adheres to the first surface 201 of the substrate 2. Hence, positions of the tape units 1 relative to the substrate 2 may be securely fixed during the encapsulating process.

Figure 9:
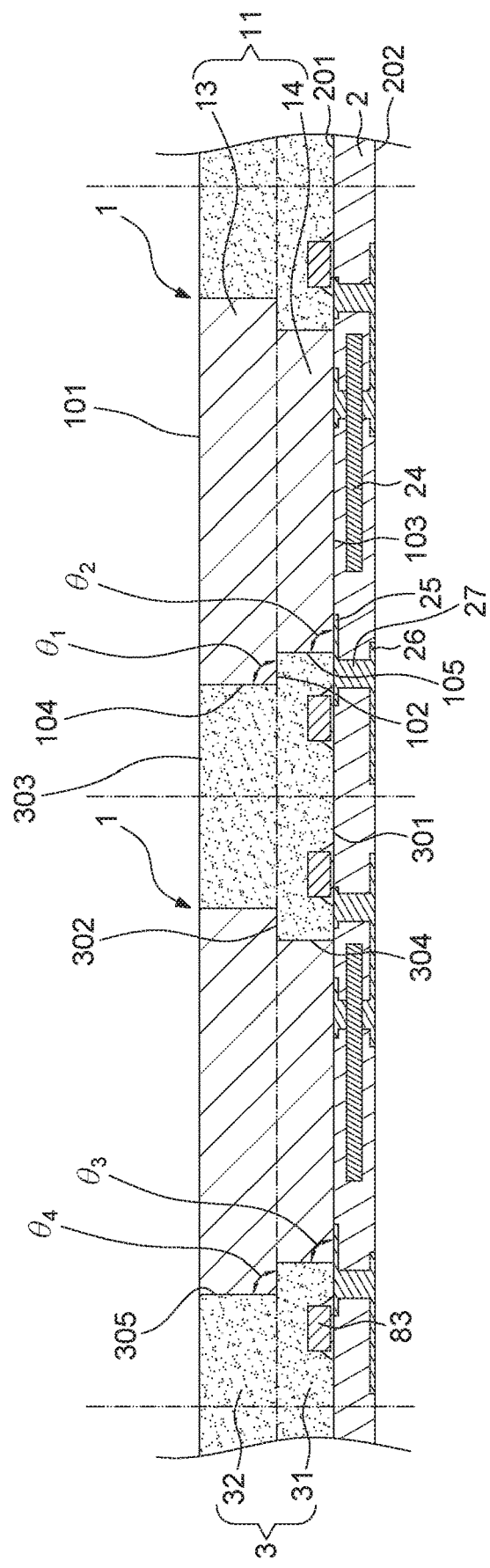
FIG. 9 illustrates one or more stages of an example of a method for manufacturing an optical device according to some embodiments of the present disclosure.

Referring to FIG. 9, an encapsulant 3 is formed on the substrate 2 to cover the passive components 83 and to surround the tape units 1. For example, a mold chase may be applied to the substrate 2, with the passive components 83 and the tape units 1 received in a cavity of the mold chase. The mold chase may press the tape units 1 toward the first surface 201 of the substrate 2. In some embodiments, the tape units 1 may be made of a flexible and compressible material, so as to adhere tightly to the substrate 2 and prevent damage to the substrate 2. Then, an encapsulant material may flow into the cavity of the mold chase. Since the third surface 103 of the base structure 11 of the tape units 1 adheres tightly to the substrate 2, the encapsulant material is prevented from flowing into a space between the tape units 1 and the surface 201 of the substrate 2. Then, the encapsulant material is cured at a curing temperature to form the encapsulant 3.

The encapsulant 3 contacts the first lateral surface 104 and the second surface 102 of the first portion 13 and the second lateral surface 105 of the second portion 14 of the base structure 11 of each of the tape unit 1. For example, the second lateral surface 305 of the second portion 32 and the second surface 302 and the first lateral surface 304 of the first portion 31 of the encapsulant 3 are respectively conformal to the first lateral surface 104 and the second surface 102 of the first portion 13 and the second lateral surface 105 of the second portion 14 of the base structure 11 of the tape unit 1. Accordingly, the first lateral surface 304 of the first portion 31 of the encapsulant 3 may be substantially perpendicular to the first surface 201 of the substrate 2. An angle $\theta_3$ between the first lateral surface 304 of the first portion 31 of the encapsulant 3 and the first surface 201 of the substrate 2 may be about 90 degrees to about 110 degrees. The second lateral surface 305 of the second portion 32 of the encapsulant 3 may be substantially perpendicular to the second surface 302 of the first portion 31 of the encapsulant 3. An angle $\theta_4$ between the second lateral surface 305 of the second portion 32 and the second surface 302 of the first portion 31 of the encapsulant 3 may be about 90 degrees to about 110 degrees.

Figure 10:
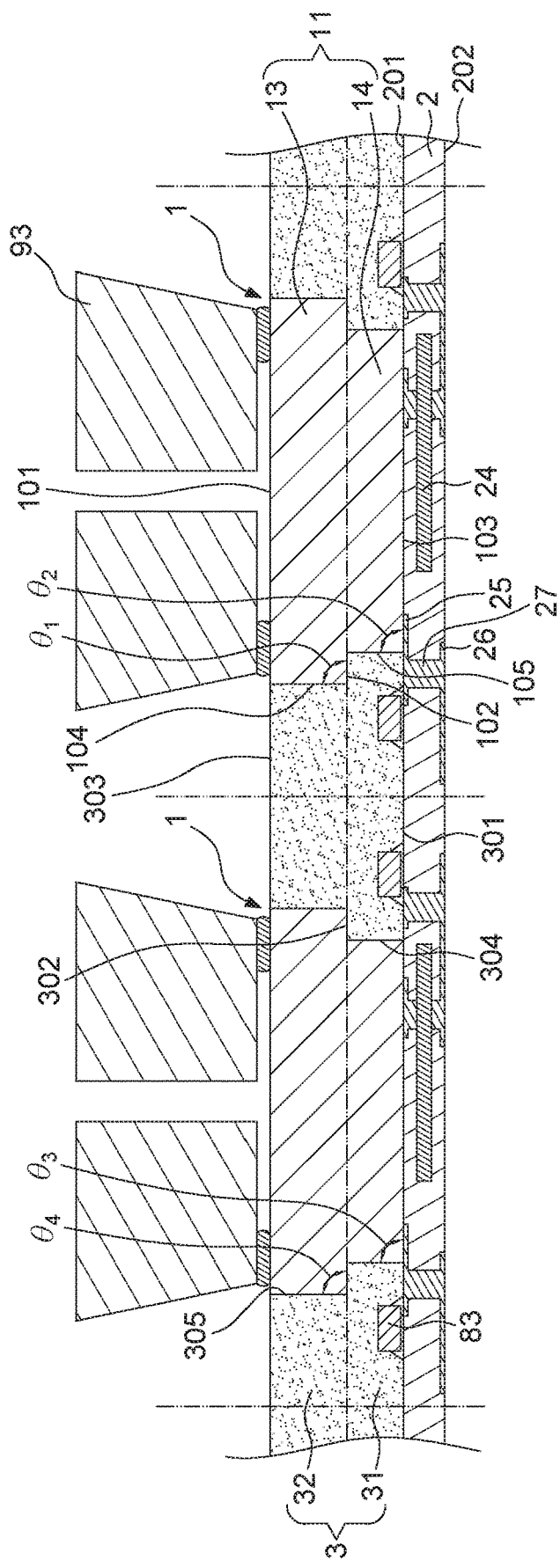
FIG. 10 illustrates one or more stages of an example of a method for manufacturing an optical device according to some embodiments of the present disclosure.

Referring to FIG. 10, each of the tape units 1 is held and removed by a vacuum nozzle 93. In some embodiments, the tape unit 1 is a thermal release tape. Accordingly, the tape unit 1 is heated to a release temperature, and is removed by the vacuum nozzle 93 under the release temperature. The release temperature of the tape unit 1 is greater than a curing temperature of the encapsulant 3. In some embodiments, since the tape unit 1 is made of a flexible and compressible material, a large draft angle or a sharp draft taper is not necessary. The tape unit 1 can be easily removed without damaging the encapsulant 3. In addition, there may be no or few residue of the tape unit 1 remains on the first surface 21 of the substrate 2.

Figure 11:
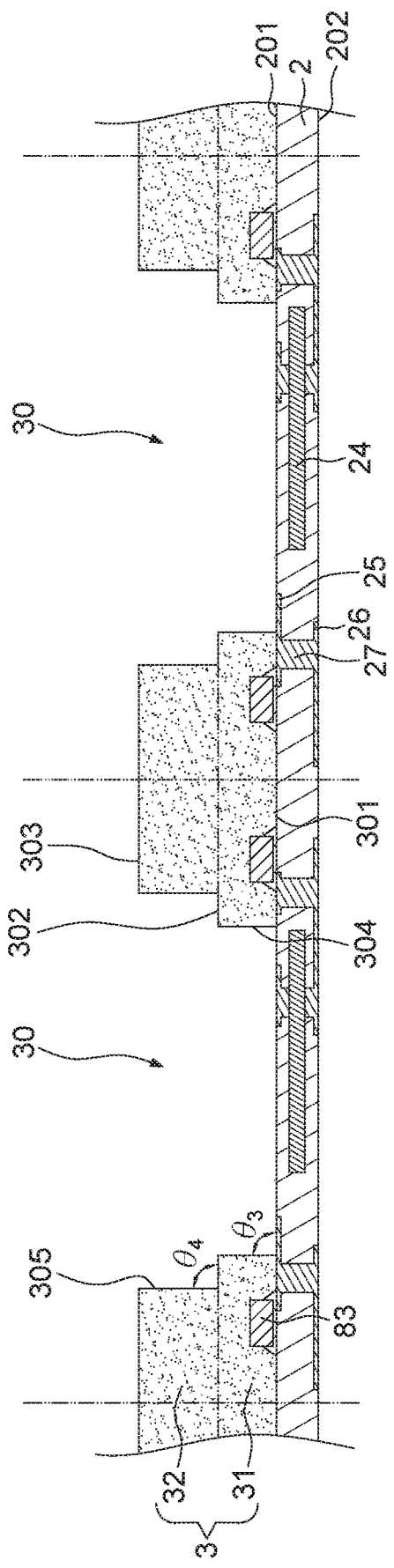
FIG. 11 illustrates one or more stages of an example of a method for manufacturing an optical device according to some embodiments of the present disclosure.

Referring to FIG. 11, each of the tape units 1 is removed to form a through hole 30 extending through the encapsulant 3. The first lateral surface 304 and the second surface 302 of the first portion 31, and the second lateral surface 305 of the second portion 32 of the encapsulant 3 jointly defines the through hole 30. The through hole 30 includes an upper portion (e.g., defined by the second lateral surface 305 of the encapsulant 3) and a lower portion (e.g., defined by the first lateral surface 304 of the encapsulant 3), and a width of the upper portion is greater than a width of the lower portion. Portions of the first surface 21 of the substrate 2 are exposed in each of the through hole 30 of the encapsulant 3.

Figure 12:
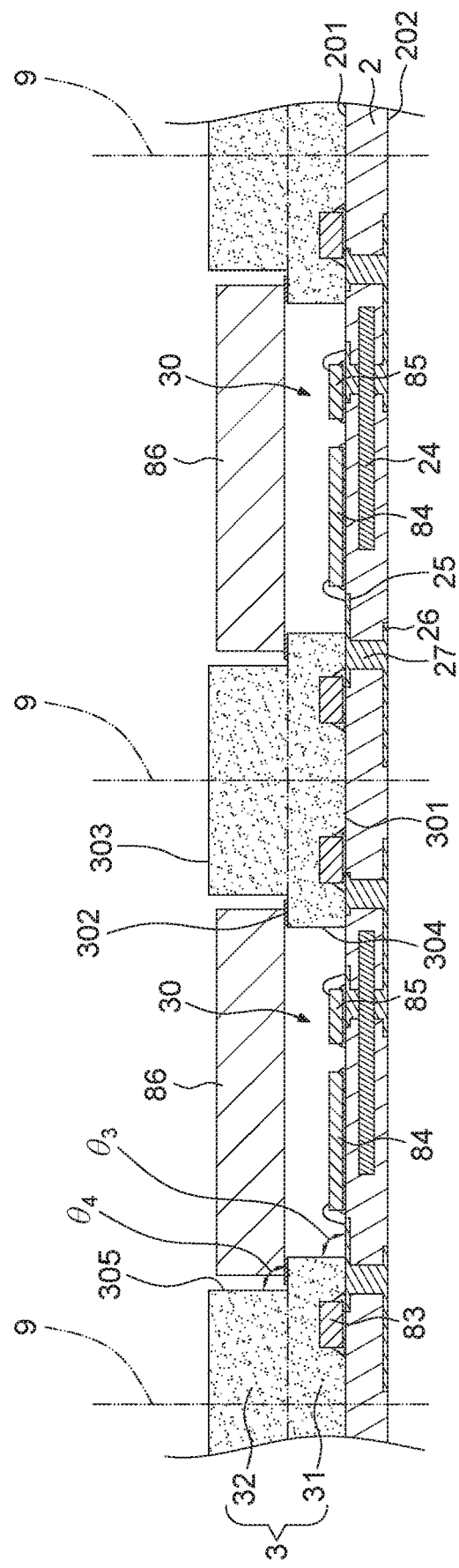
FIG. 12 illustrates one or more stages of an example of an encapsulating process according to some embodiments of the present disclosure.

Referring to FIG. 12, a light emitting component 84 and a light receiving component 85 are disposed side by side on the exposed portions of the first surface 201 of the substrate 2 and in each of the through holes 30. Further, the light emitting component 84 and the light receiving component 85 are electrically connected to the substrate 2. For example, the light emitting component 84 and the light receiving component 85 are electrically connected to the first circuit layer 25 and/or the semiconductor chip 24 of the substrate 2. Then, an optical lens 86 is disposed on or attached to the second surface 302 of the second portion 32 of the encapsulant 3 to cover the light emitting component 84 and the light receiving component 85. Then, a singulation process is conducted to the substrate 2 and the encapsulant 3 along the cutting lines 9, thus forming a plurality of optical devices, such as the optical devices 8 shown in FIG. 6.

Figure 13:
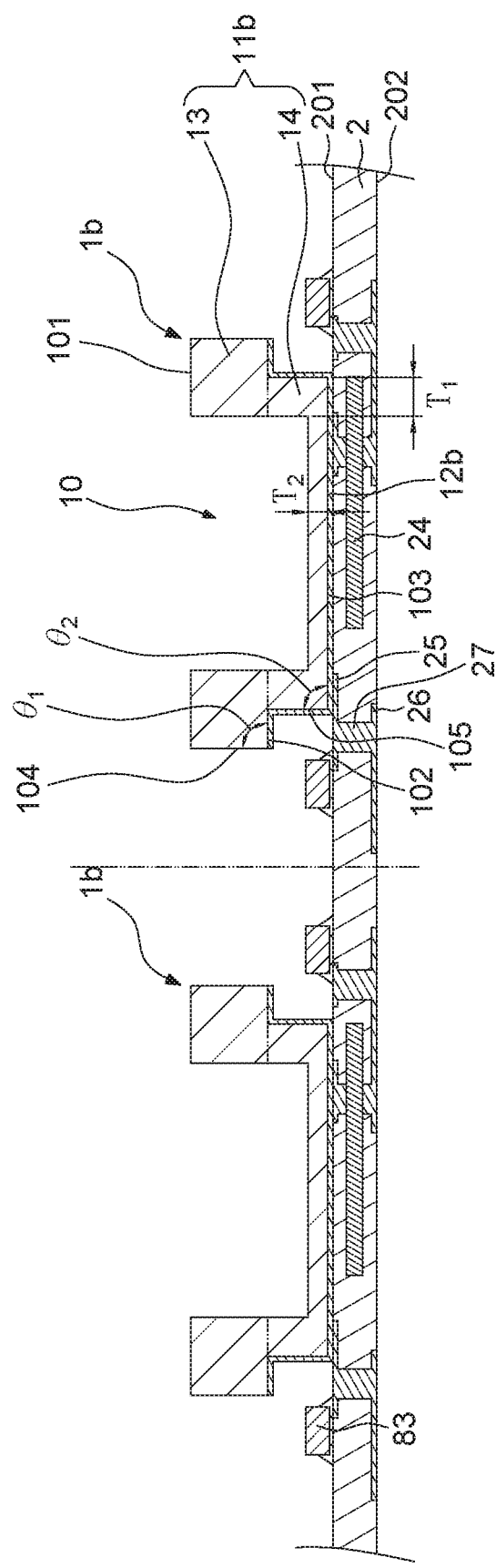
FIG. 13 illustrates one or more stages of an example of a method for manufacturing an optical device according to some embodiments of the present disclosure.
Figure 14:
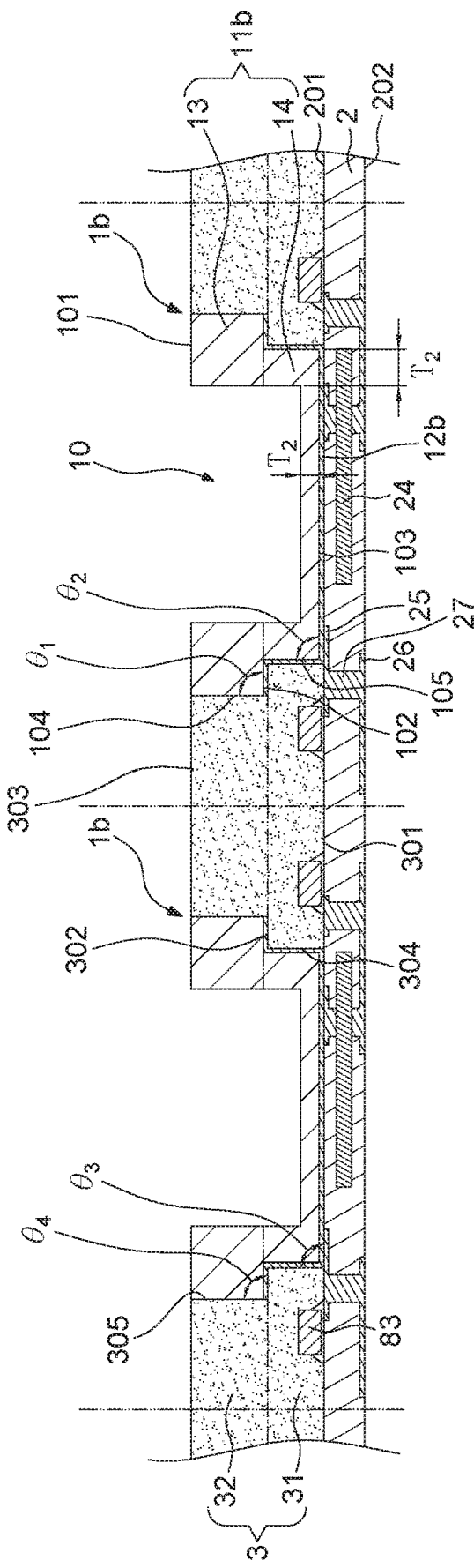
FIG. 14 illustrates one or more stages of an example of a method for manufacturing an optical device according to some embodiments of the present disclosure.
Figure 15:
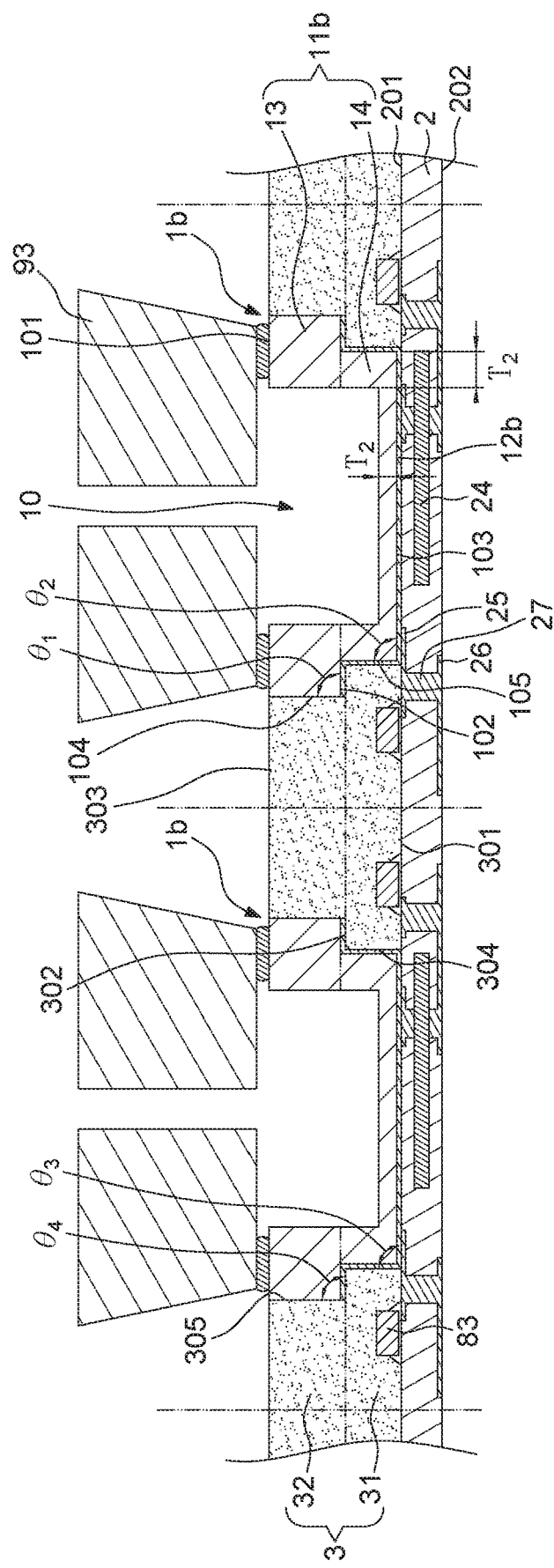
FIG. 15 illustrates one or more stages of an example of a method for manufacturing an optical device according to some embodiments of the present disclosure.

FIGS. 13 to 15 illustrate an encapsulating process according to some embodiments of the present disclosure. In some embodiments, the encapsulating process can be used for manufacturing an optical device such as the optical device 1 shown in FIG. 6. The encapsulating process utilizes at least one tape unit, such as two of the tape units 1b shown in FIG. 5. The initial stages of the illustrated process are the same as, or similar to, the stages illustrated in FIG. 7. FIG. 13 depicts a stage subsequent to that depicted in FIG. 7.

Referring to FIG. 13, at least one tape unit, such as two tape units 1b, is disposed on the substrate 2. The tape unit 1b is similar to the tape unit 1 shown in FIG. 1, except that the base structure 11b defines a cavity 10, and the tape unit 1b further includes an adhesive layer 12b.

The cavity 10 is recessed from the first surface 101 of the first portion 13 thereof. The cavity 10 extends through the first portion 13 into the second portion 14 of the base structure 11b. The second portion 14 of the base structure 11b has a first thickness $T_1$ between the cavity 10 and the second lateral surface 105, and a second thickness $T_2$ between the cavity 10 and the third surface 103. The first thickness $T_1$ is greater than the second thickness $T_2$. The adhesive layer 12b is disposed on the third surface 103 and the second lateral surface 105 of the second portion 14 and the second surface 102 of the first portion 13 of the base structure 11b. The tape unit 1b is adhered to the substrate 2 through the adhesive layer 12b.

Referring to FIG. 14, an encapsulant 3 is formed on the substrate 2 to cover the passive components 83 and to surround the tape units 1b. The encapsulant 3 contacts the first lateral surface 104 of the first portion 13 of the base structure 11b and a portion of the adhesive layer 12b of each of the tape unit 1. Since the first thickness $T_1$ is greater than the second thickness $T_2$, the base structure 11b provides sufficient resistance along a direction of the first thickness $T_1$. That is, the base structure 11b may not deform during formation of the encapsulant 3.

Referring to FIG. 15, the each of the tape units 1b is held and removed by a vacuum nozzle 93. In some embodiments, the tape unit 1b is a thermal release tape. Accordingly, the tape unit 1b is heated to a release temperature, and is removed by the vacuum nozzle 93 under the release temperature. When heating the tape units 1b, due to the arrangement of the cavity 10, heat may be sufficiently transferred to the adhesive layer 12b. Accordingly, the tape units 1b may be easily peeled off from the encapsulant 3. In addition, during the vacuum suction of the vacuum nozzle 93, the empty cavity 10 may facilitate the shrinkage of the tape unit 1b toward the center of the tape unit 1b, and a plurality of gaps or voids tape between the tape unit 1b and the encapsulant 3 may occur readily. Thus, the adhesion area or bonding area between the tape unit 1b and the encapsulant 3 is reduced. As a result, when the vacuum nozzle 93 pulls the tape unit 1b to move upward, the tape unit 1b may be further easily peeled off from the encapsulant 3. Hence, residue of the adhesive layer 12b on the second surface 302 and the first lateral surface 304 of the encapsulant 3 and/or the exposed portion of the first surface 21 of the substrate 2 may be avoided.

The stages subsequent to that shown in FIG. 15 of the illustrated process are similar to the stages illustrated in FIGS. 11 to 12, thus forming the optical device 1 shown in FIG. 6.

Figure 16:
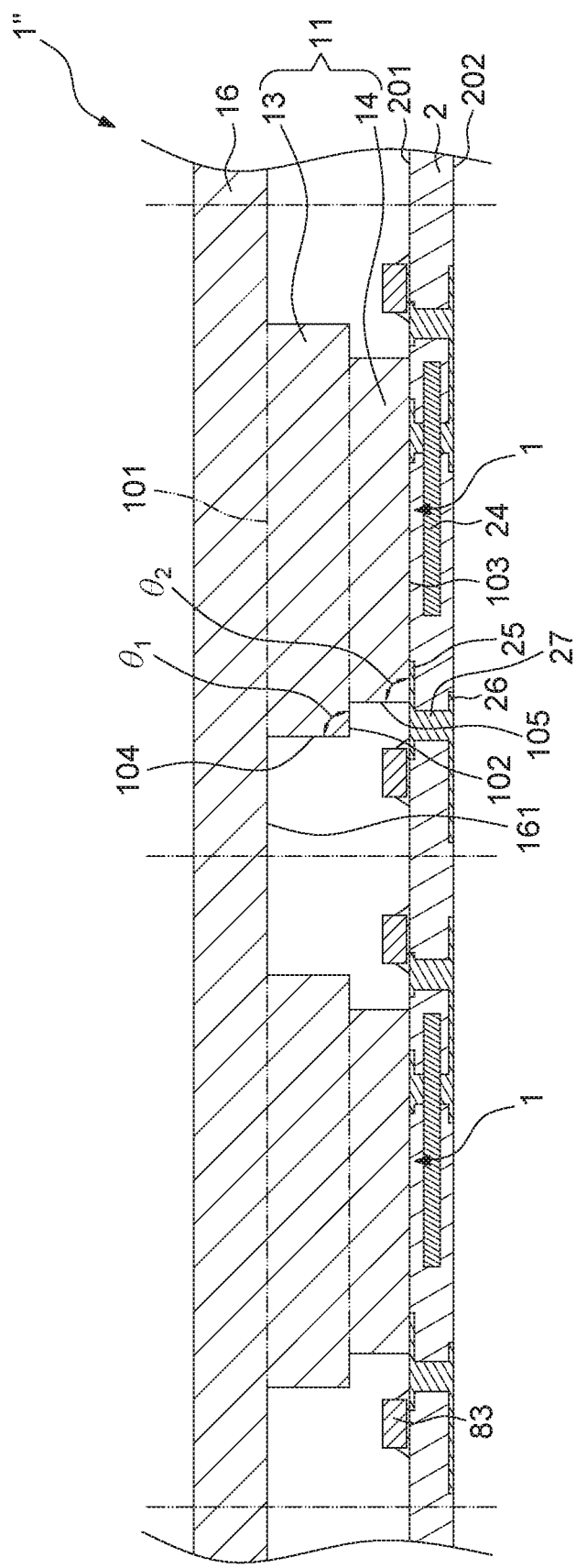
FIG. 16 illustrates one or more stages of an example of a method for manufacturing an optical device according to some embodiments of the present disclosure.
Figure 17:
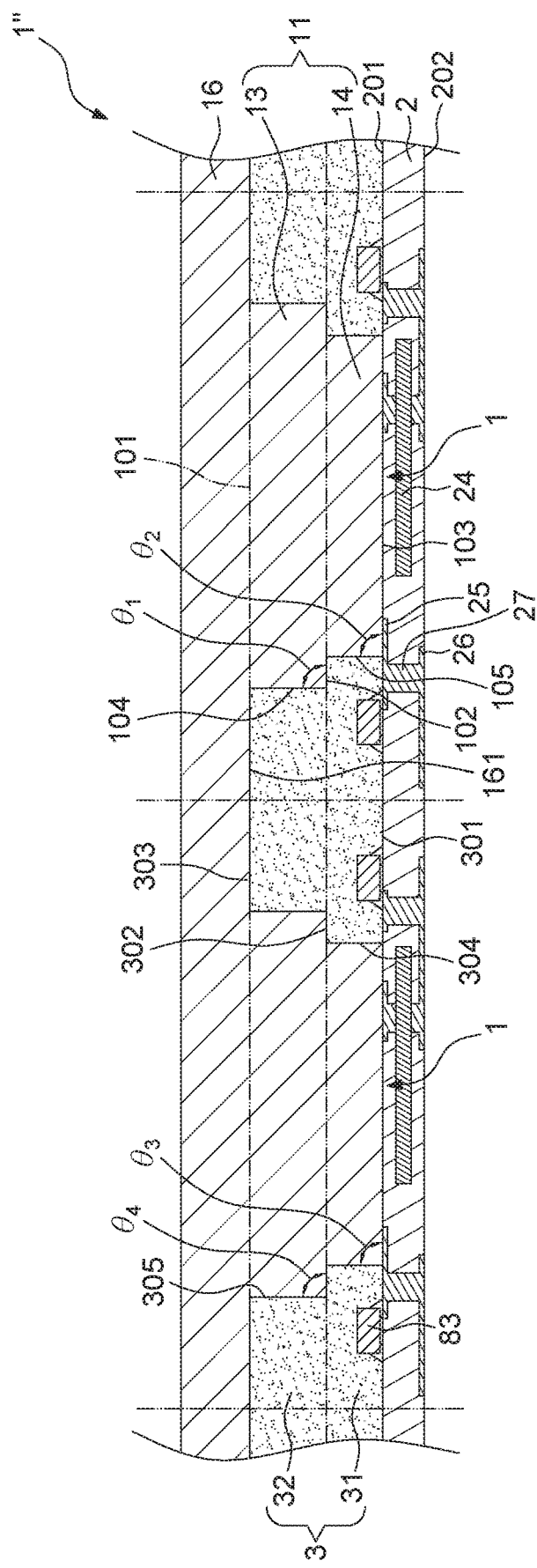
FIG. 17 illustrates one or more stages of an example of a method for manufacturing an optical device according to some embodiments of the present disclosure.

FIGS. 16 to 17 illustrate an encapsulating process according to some embodiments of the present disclosure. In some embodiments, the encapsulating process can be used for manufacturing an optical device such as the optical device 1 shown in FIG. 6. The encapsulating process utilizes at least one tape unit, such as the tape 1" including two of the tape units 1 shown in FIG. 2. The initial stages of the illustrated process are the same as, or similar to, the stages illustrated in FIG. 7. FIG. 16 depicts a stage subsequent to that depicted in FIG. 7.

Referring to FIG. 16, a tape 1", including two tape units 1 and a carrier portion 16, is disposed on the substrate 2. The tape units 1 are similar to the tape units 1 shown in FIG. 8, but are disposed on and contacts the carrier portion 16. As shown in FIG. 16, the first surface 101 of the first portion 13 of the base structure 11 of the tape unit 1 is disposed on and contacts a surface 161 of the carrier portion 16. That is, the first surface 101 is an imaginary plane. The third surface 103 of the second portion 14 of the base structure 11 of the tape unit 1 is disposed on and contacts the first surface 201 of the substrate 2.

Referring to FIG. 17, an encapsulant 3 is formed on the substrate 2 to cover the passive components 83 and to surround the tape units 1. The encapsulant 3 contacts the first lateral surface 104 and the second surface 102 of the first portion 13 and the second lateral surface 105 of the second portion 14 of the base structure 11 of each of the tape unit 1, and further contacts the carrier portion 16 of the tape 1". For example, the second lateral surface 305 of the second portion 32 and the second surface 302 and the first lateral surface 304 of the first portion 31 of the encapsulant 3 are respectively conformal to the first lateral surface 104 and the second surface 102 of the first portion 13 and the second lateral surface 105 of the second portion 14 of the base structure 11 of the tape unit 1. Besides, the third surface 303 of the second portion 32 of the encapsulant 3 is conformal to the surface 161 of the carrier portion 16 of the tape 1".

After formation of the encapsulant 3, the tape 1" may be removed. That is, the plurality of tape units 1 and the carrier portion 16 are removed together to form a plurality of through holes 30 extending through the encapsulant 3, as shown in FIG. 11.

Portions of the substrate 2, such as the first surface 201 of the substrate 2, are exposed from the through holes 30 of the encapsulant 3. In some embodiments, the tape 1″ is a monolithic structure, thus the tape units 1 and the carrier portion 16 may be easily removed by simply pulling the carrier portion 16.

The stages subsequent to that shown in FIG. 17 of the illustrated process are similar to the stages illustrated in FIGS. 11 to 12, thus forming the optical device 8 shown in FIG. 6.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A tape, comprising:
   at least one tape unit, comprising:
   a base structure having a first portion and a second portion, wherein the first portion has a first surface and a second surface opposite to the first surface, the second portion protrudes from the second surface of the first portion, and has a third surface opposite to the first surface of the first portion and a lateral surface extending between the second surface and the third surface, and the second surface of the first portion and the lateral surface of the second portion define an indentation structure; and
   an adhesive layer disposed on the third surface of the second portion of the base structure.

2. The tape of claim 1, wherein the base structure defines a cavity recessed from the first surface of the first portion.

3. The tape of claim 2, wherein the cavity extends through the first portion into the second portion of the base structure.

4. The tape of claim 2, wherein the second portion of the base structure has a first thickness between the cavity and the lateral surface, and a second thickness between the cavity and the third surface, and the first thickness is greater than the second thickness.

5. The tape of claim 1, wherein the first portion further has a lateral surface extending between the first surface and the second surface, and an angle between the second surface and the lateral surface of the first portion is about 90 degrees to about 110 degrees.

6. The tape of claim 1, wherein an angle between the third surface and the lateral surface of the second portion is about 90 degrees to about 110 degrees.

7. The tape of claim 1, wherein an area of the first portion from a top view is greater than an area of the second portion from a top view.

8. The tape of claim 1, wherein the first portion extends beyond the lateral surface of the second portion.

9. An encapsulating process, comprising:
(a) providing a substrate;
(b) disposing at least one tape unit on the substrate, wherein the tape unit includes a base structure, the base structure has a first portion and a second portion, the first portion has a first surface, a second surface opposite to the first surface and a first lateral surface extending between the first surface and the second surface, the second portion protrudes from the second surface, and has a third surface opposite to the first surface of the first portion and a second lateral surface extending between the second surface and the third surface, and the second surface of the first portion and the lateral surface of the second portion define an indentation structure; and
(c) forming an encapsulant surrounding the tape unit.

10. The process of claim 9, wherein after (a), the method further comprises:
(a1) electrically connecting at least one passive component on the substrate;
wherein in (c), the encapsulant covers the passive component.

11. The process of claim 9, wherein the tape unit further comprises an adhesive layer disposed on the third surface of the second portion of the base structure, and in (b), the tape unit is adhered to the substrate through the adhesive layer.

12. The process of claim 9, wherein in (c), the encapsulant contacts the first lateral surface and the second surface of the first portion of the base structure of the tape unit, and contacts the second lateral surface of the second portion of the base structure of the tape unit.

13. The process of claim 9, further comprising:
(d) removing the tape unit to form a through hole extending through the encapsulant.

14. The process of claim 13, wherein the through hole includes an upper portion and a lower portion, and a width of the upper portion is greater than a width of the lower portion.

15. The process of claim 13, wherein the tape unit is a thermal release tape, and (d) includes heating the tape unit to a release temperature of the tape unit, and removing the tape unit under the release temperature.

16. The process of claim 15, wherein the release temperature of the tape unit is greater than a curing temperature of the encapsulant.

17. The process of claim 9, wherein the at least one tape unit includes a plurality of tape units disposed on a carrier portion, and the process further comprising:
(d) removing the plurality of tape units and the carrier portion together to form a plurality of through holes extending through the encapsulant, wherein portions of the substrate are exposed from the through holes.

18. The process of claim 9, wherein in (b), an area of the first portion from a top view is greater than an area of the second portion from a top view.

* * * * *